United States Patent
Shalvi et al.

(10) Patent No.: US 8,000,141 B1
(45) Date of Patent: Aug. 16, 2011

(54) COMPENSATION FOR VOLTAGE DRIFTS IN ANALOG MEMORY CELLS

(75) Inventors: Ofir Shalvi, Ra'anana (IL); Naftali Sommer, Rishon Le-Zion (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 357 days.

(21) Appl. No.: 12/251,471

(22) Filed: Oct. 15, 2008

Related U.S. Application Data

(60) Provisional application No. 60/981,116, filed on Oct. 19, 2007, provisional application No. 60/982,480, filed on Oct. 25, 2007, provisional application No. 60/983,272, filed on Oct. 29, 2007, provisional application No. 61/045,628, filed on Apr. 17, 2008.

(51) Int. Cl.
*G11C 11/34* (2006.01)

(52) U.S. Cl. .......... 365/185.09; 365/185.22; 365/185.19

(58) Field of Classification Search ............. 365/185.09, 365/185.22, 185.19, 185.03, 185.2, 189.07, 365/185.21
See application file for complete search history.

(56) References Cited

U.S. PATENT DOCUMENTS

| | | | |
|---|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotra et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |

(Continued)

FOREIGN PATENT DOCUMENTS

EP 0783754 B1 7/1997

(Continued)

OTHER PUBLICATIONS

U.S. Appl. No. 11/949,135 Official Action dated Oct. 2, 2009.

(Continued)

*Primary Examiner* — Dang T Nguyen
(74) *Attorney, Agent, or Firm* — D. Kligler I.P. Services Ltd.

(57) ABSTRACT

A method for data storage includes storing data in a group of analog memory cells by writing respective first storage values into the memory cells. After storing the data, respective second storage values are read from the memory cells. A subset of the memory cells, in which the respective second storage values have drifted below a minimum readable value, is identified. The memory cells in the subset are operated on, so as to cause the second storage values of at least one of the memory cells in the subset to exceed the minimum readable value. At least the modified second storage values are re-read so as to reconstruct the stored data.

28 Claims, 5 Drawing Sheets

U.S. PATENT DOCUMENTS

| | | |
|---|---|---|
| 5,388,064 A | 2/1995 | Khan |
| 5,416,646 A | 5/1995 | Shirai |
| 5,416,782 A | 5/1995 | Wells et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A * | 7/1996 | Auclair et al. ................ 365/201 |
| 5,541,886 A | 7/1996 | Hasbun |
| 5,600,677 A | 2/1997 | Citta et al. |
| 5,657,332 A | 8/1997 | Auclair et al. |
| 5,675,540 A | 10/1997 | Roohparvar |
| 5,682,352 A | 10/1997 | Wong et al. |
| 5,696,717 A | 12/1997 | Koh |
| 5,726,649 A | 3/1998 | Tamaru et al. |
| 5,742,752 A | 4/1998 | De Koning |
| 5,751,637 A | 5/1998 | Chen et al. |
| 5,761,402 A | 6/1998 | Kaneda et al. |
| 5,798,966 A | 8/1998 | Keeney |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,969,986 A | 10/1999 | Wong et al. |
| 5,991,517 A | 11/1999 | Harari et al. |
| 5,995,417 A | 11/1999 | Chen et al. |
| 6,009,014 A | 12/1999 | Hollmer et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,166,962 A | 12/2000 | Chen et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,275,419 B1 | 8/2001 | Guterman et al. |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,396,742 B1 | 5/2002 | Korsh et al. |
| 6,397,364 B1 | 5/2002 | Barkan |
| 6,405,323 B1 | 6/2002 | Lin et al. |
| 6,418,060 B1 | 7/2002 | Yang et al. |
| 6,442,585 B1 | 8/2002 | Dean et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,558,967 B1 | 5/2003 | Wong |
| 6,560,152 B1 | 5/2003 | Cernea |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,687,155 B2 | 2/2004 | Nagasue |
| 6,707,748 B2 | 3/2004 | Lin et al. |
| 6,708,257 B2 | 3/2004 | Bao |
| 6,717,847 B2 | 4/2004 | Chen |
| 6,731,557 B2 | 5/2004 | Beretta |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,807,095 B2 | 10/2004 | Chen et al. |
| 6,809,964 B2 | 10/2004 | Moschopoulos et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,894,926 B2 | 5/2005 | Guterman et al. |
| 6,907,497 B2 | 6/2005 | Hosono et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 7,002,843 B2 | 2/2006 | Guterman et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,151,692 B2 | 12/2006 | Wu |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzalez et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,928 B2 | 3/2007 | Chen |
| 7,197,594 B2 | 3/2007 | Raz et al. |

| Patent No. | Date | Inventor(s) |
|---|---|---|
| 7,200,062 B2 | 4/2007 | Kinsely et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzawa |
| 7,280,398 B1 | 10/2007 | Lee |
| 7,280,409 B2 * | 10/2007 | Misumi et al. .......... 365/185.28 |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,272 B1 | 12/2007 | Mokhlesi et al. |
| 7,310,347 B2 | 12/2007 | Lasser |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,388,781 B2 | 6/2008 | Litsyn et al. |
| 7,397,697 B2 | 7/2008 | So et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,440,324 B2 | 10/2008 | Mokhlesi |
| 7,441,067 B2 | 10/2008 | Gorobets et al. |
| 7,453,737 B2 | 11/2008 | Ha |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,471,581 B2 | 12/2008 | Tran et al. |
| 7,492,641 B2 | 2/2009 | Hosono et al. |
| 7,508,710 B2 | 3/2009 | Mokhlesi |
| 7,539,062 B2 | 5/2009 | Doyle |
| 7,551,492 B2 | 6/2009 | Kim |
| 7,568,135 B2 | 7/2009 | Cornwell et al. |
| 7,570,520 B2 | 8/2009 | Kamei et al. |
| 7,593,259 B2 | 9/2009 | Kim |
| 7,596,707 B1 | 9/2009 | Vemula |
| 7,631,245 B2 | 12/2009 | Lasser |
| 7,633,798 B2 | 12/2009 | Sarin et al. |
| 7,633,802 B2 | 12/2009 | Mokhlesi |
| 7,656,734 B2 * | 2/2010 | Thorp et al. ................ 365/211 |
| 7,660,158 B2 | 2/2010 | Aritome |
| 7,660,183 B2 | 2/2010 | Ware et al. |
| 7,742,351 B2 | 6/2010 | Inoue et al. |
| 7,761,624 B2 | 7/2010 | Karamchetti et al. |
| 7,810,017 B2 | 10/2010 | Radke |
| 7,885,119 B2 | 2/2011 | Li |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0118574 A1 | 8/2002 | Gongwer et al. |
| 2002/0133684 A1 | 9/2002 | Anderson |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0157555 A1 * | 7/2005 | Ono et al. ................ 365/185.18 |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Less |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 * | 5/2007 | Cohen et al. ............ 365/185.19 |
| 2007/0118713 A1 | 5/2007 | Guterman et al. |
| 2007/0143378 A1 | 6/2007 | Gorobets |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |

| | | | |
|---|---|---|---|
| 2007/0291571 | A1 | 12/2007 | Balasundaram |
| 2007/0297234 | A1 | 12/2007 | Cernea et al. |
| 2008/0010395 | A1 | 1/2008 | Mylly et al. |
| 2008/0025121 | A1 | 1/2008 | Tanzawa |
| 2008/0043535 | A1 | 2/2008 | Roohparvar |
| 2008/0049504 | A1 | 2/2008 | Kasahara et al. |
| 2008/0049506 | A1 | 2/2008 | Guterman |
| 2008/0052446 | A1 | 2/2008 | Lasser et al. |
| 2008/0055993 | A1 | 3/2008 | Lee |
| 2008/0080243 | A1 | 4/2008 | Edahiro et al. |
| 2008/0082730 | A1 | 4/2008 | Kim et al. |
| 2008/0089123 | A1 | 4/2008 | Chae et al. |
| 2008/0104309 | A1 | 5/2008 | Cheon et al. |
| 2008/0104312 | A1 | 5/2008 | Lasser |
| 2008/0109590 | A1 | 5/2008 | Jung et al. |
| 2008/0115017 | A1 | 5/2008 | Jacobson |
| 2008/0123420 | A1 | 5/2008 | Brandman et al. |
| 2008/0126686 | A1 | 5/2008 | Sokolov et al. |
| 2008/0130341 | A1 | 6/2008 | Shalvi et al. |
| 2008/0148115 | A1 | 6/2008 | Sokolov et al. |
| 2008/0151618 | A1* | 6/2008 | Sharon et al. ............ 365/185.02 |
| 2008/0151667 | A1 | 6/2008 | Miu et al. |
| 2008/0158958 | A1 | 7/2008 | Sokolov et al. |
| 2008/0181001 | A1 | 7/2008 | Shalvi |
| 2008/0198650 | A1 | 8/2008 | Shalvi et al. |
| 2008/0198654 | A1 | 8/2008 | Toda |
| 2008/0209116 | A1 | 8/2008 | Caulkins |
| 2008/0209304 | A1 | 8/2008 | Winarski et al. |
| 2008/0215798 | A1 | 9/2008 | Sharon et al. |
| 2008/0219050 | A1 | 9/2008 | Shalvi et al. |
| 2008/0239093 | A1 | 10/2008 | Easwar et al. |
| 2008/0239812 | A1 | 10/2008 | Abiko et al. |
| 2008/0253188 | A1 | 10/2008 | Aritome |
| 2008/0263262 | A1 | 10/2008 | Sokolov et al. |
| 2008/0282106 | A1 | 11/2008 | Shalvi et al. |
| 2009/0013233 | A1 | 1/2009 | Radke |
| 2009/0024905 | A1 | 1/2009 | Shalvi et al. |
| 2009/0034337 | A1 | 2/2009 | Aritome |
| 2009/0043831 | A1 | 2/2009 | Antonopoulos et al. |
| 2009/0043951 | A1 | 2/2009 | Shalvi et al. |
| 2009/0049234 | A1 | 2/2009 | Oh et al. |
| 2009/0073762 | A1 | 3/2009 | Lee et al. |
| 2009/0086542 | A1 | 4/2009 | Lee et al. |
| 2009/0089484 | A1 | 4/2009 | Chu |
| 2009/0091979 | A1 | 4/2009 | Shalvi |
| 2009/0094930 | A1 | 4/2009 | Schwoerer |
| 2009/0106485 | A1 | 4/2009 | Anholt |
| 2009/0112949 | A1 | 4/2009 | Ergan et al. |
| 2009/0132755 | A1 | 5/2009 | Radke |
| 2009/0144600 | A1 | 6/2009 | Perlmutter et al. |
| 2009/0150894 | A1 | 6/2009 | Huang et al. |
| 2009/0157950 | A1 | 6/2009 | Selinger |
| 2009/0172257 | A1 | 7/2009 | Prins et al. |
| 2009/0172261 | A1 | 7/2009 | Prins et al. |
| 2009/0204824 | A1 | 8/2009 | Lin et al. |
| 2009/0204872 | A1 | 8/2009 | Yu et al. |
| 2009/0225595 | A1 | 9/2009 | Kim |
| 2009/0265509 | A1 | 10/2009 | Klein |
| 2009/0300227 | A1 | 12/2009 | Nochimowski et al. |
| 2009/0323412 | A1 | 12/2009 | Mokhlesi et al. |
| 2009/0327608 | A1 | 12/2009 | Eschmann |
| 2010/0017650 | A1 | 1/2010 | Chin et al. |
| 2010/0034022 | A1 | 2/2010 | Dutta et al. |
| 2010/0057976 | A1 | 3/2010 | Lasser |
| 2010/0061151 | A1 | 3/2010 | Miwa et al. |
| 2010/0110580 | A1 | 5/2010 | Takashima |
| 2010/0142268 | A1 | 6/2010 | Aritome |
| 2010/0142277 | A1 | 6/2010 | Yang et al. |
| 2010/0169743 | A1 | 7/2010 | Vogan et al. |

FOREIGN PATENT DOCUMENTS

| | | | |
|---|---|---|---|
| EP | 1434236 | B1 | 6/2004 |
| EP | 1605509 | A1 | 12/2005 |
| WO | 9610256 | A1 | 4/1996 |
| WO | 9828745 | A1 | 7/1998 |
| WO | 02100112 | A1 | 12/2002 |
| WO | 03100791 | A1 | 12/2003 |
| WO | 2007046084 | A2 | 4/2007 |
| WO | 2007132452 | A2 | 11/2007 |
| WO | 2007132453 | A2 | 11/2007 |
| WO | 2007132456 | A2 | 11/2007 |
| WO | 2007132457 | A2 | 11/2007 |
| WO | 2007132458 | A2 | 11/2007 |
| WO | 2007146010 | A2 | 12/2007 |
| WO | 2008026203 | A2 | 3/2008 |
| WO | 2008053472 | A2 | 5/2008 |
| WO | 2008053473 | A2 | 5/2008 |
| WO | 2008068747 | A2 | 6/2008 |
| WO | 2008077284 | A1 | 7/2008 |
| WO | 2008083131 | A2 | 7/2008 |
| WO | 2008099958 | A1 | 8/2008 |
| WO | 2008111058 | A2 | 9/2008 |
| WO | 2008124760 | A2 | 10/2008 |
| WO | 2008139441 | A2 | 11/2008 |
| WO | 2009037691 | A2 | 3/2009 |
| WO | 2009037697 | A2 | 3/2009 |
| WO | 2009038961 | A2 | 3/2009 |
| WO | 2009050703 | A2 | 4/2009 |
| WO | 2009053961 | A2 | 4/2009 |
| WO | 2009053962 | A2 | 4/2009 |
| WO | 2009053963 | A2 | 4/2009 |
| WO | 2009072100 | A2 | 6/2009 |
| WO | 2009072101 | A2 | 6/2009 |
| WO | 2009072102 | A2 | 6/2009 |
| WO | 2009072103 | A2 | 6/2009 |
| WO | 2009072104 | A2 | 6/2009 |
| WO | 2009072105 | A2 | 6/2009 |
| WO | 2009074978 | A2 | 6/2009 |
| WO | 2009074979 | A2 | 6/2009 |
| WO | 2009078006 | A2 | 6/2009 |
| WO | 2009095902 | A2 | 8/2009 |

OTHER PUBLICATIONS

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No. 12/822,207 "Adaptive Over-Provisioning in Memory Systems" filed on Jun. 24, 2010.

U.S. Appl. No. 12/019,011 Official Action dated Nov. 20, 2009.

Takeuchi et al., "A Multipage Cell Architecture for High-Speed Programming Multilevel NAND Flash Memories", IEEE Journal of Solid State Circuits, vol. 33, No. 8, Aug. 1998.

U.S. Appl. No. 12/880,101 "Reuse of Host Hibernation Storage Space by Memory Controller", filed on Sep. 12, 2010.

U.S. Appl. No. 12/890,724 "Error Correction Coding Over Multiple Memory Pages", filed on Sep. 27, 2010.

U.S. Appl. No. 12/171,797 Official Action dated Aug. 25, 2010.

U.S. Appl. No. 12/497,707 Official Action dated Sep. 15, 2010.

U.S. Appl. No. 11/995,801 Official Action dated Oct. 15, 2010.

Numonyx, "M25PE16: 16-Mbit, page-erasable serial flash memory with byte-alterability, 75 MHz SPI bus, standard pinout", Apr. 2008.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

U.S. Appl. No. 11/945,575 Official Action dated Aug. 24, 2010.

U.S. Appl. No. 12/045,520 Official Action dated Nov. 16, 2010.

Jedec Standard JESD84-C44, "Embedded MultiMediaCard (e•MMC) Mechanical Standard, with Optional Reset Signal", Jedec Solid State Technology Association, USA, Jul. 2009.

Jedec, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference , New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{th}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

International Application PCT/IL2008/001446 "Optimized selection of memory chips in multi-chip memory devices" filed on Nov. 4, 2008.

Perlmutter et al, U.S. Appl. No. 12/332,368 "Efficient Interference Cancellation in Analog Memory Cell Arrays" filed on Dec. 11, 2008.

Kasorla et al, U.S. Appl. No. 12/332,370 "Efficient Data Storage in Multi-Plane Memory Devices" filed on Dec. 11, 2008.

Sommer, N., U.S. Appl. No. 12/364,531 "Parameter Estimation Based on Error Correction Code Parity Check Equations" filed on Feb. 3, 2009.

Golov et al., U.S. Appl. No. 12/344,233 "Wear Level Estimation in Analog Memory Cells" filed on Dec. 25, 2008.

Perlmutter et al., U.S. Appl. No. 12/388,528 "Programming of Analog Memory Cells Using a Single Programming Pulse per State Transition" filed on Feb. 19, 2009.

Perlmutter et al., U.S. Appl. No. 12/390,522 "Programming Analog Memory Cells for Reduced Variance After Retention" filed on Feb. 23, 2009.

Perlmutter et al., U.S. Appl. No. 12/405,275 "Memory Device with Multiple-Accuracy Read Commands" filed on Mar. 17, 2009.

Perlmutter et al., U.S. Appl. No. 12/397,368 "Efficient Readout from Analog Memory Cells Using Data Compression" filed on Mar. 4, 2009.

Sommer, N., U.S. Appl. No. 12/171,797 "Memory Device with Non-Uniform Programming Levels" filed on Jul. 11, 2008.

U.S. Appl. No. 11/995,814 Official Action dated Dec. 17, 2010.

U.S. Appl. No. 12/388,528 Official Action dated Nov. 29, 2010.

Super User Forums, "SD Card Failure, can't read superblock", posted Aug. 8, 2010.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director Article Base, posted Sep. 5, 2009.

Ubuntu Forums, "Memory Stick Failed IO Superblock", posted Nov. 11, 2009.

U.S. Appl. No. 13/021,754, filed Feb. 6, 2011.

U.S. Appl. No. 12/987,174, filed Jan. 10, 2011.

U.S. Appl. No. 12/987,175, filed Jan. 10, 2011.

U.S. Appl. No. 12/963,649, filed Dec. 9, 2010.

U.S. Appl. No. 12/534,898 Official Action dated Mar. 23, 2011.

U.S. Appl. No. 13/047,822, filed Mar. 15, 2011.

U.S. Appl. No. 13/069,406, filed Mar. 23, 2011.

U.S. Appl. No. 13/088,361, filed Apr. 17, 2011.

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

U.S. Appl. No. 12/344,233 Official Action dated Jun. 24, 2011.

U.S. Appl. No. 11/995,813 Official Action dated Jun. 16, 2011.

Berman et al., "Mitigating Inter-Cell Coupling Effects in MLC NAND Flash via Constrained Coding", Flash Memory Summit, Santa Clara, USA, Aug. 19, 2010.

U.S. Appl. No. 12/178,318 Official Action dated May 31, 2011.

CN Patent Application # 200780026181.3 Official Action dated Apr. 8, 2011.

US 7,161,836, 01/2007, Wan et al. (withdrawn)

* cited by examiner

COMPENSATION FOR VOLTAGE DRIFTS IN ANALOG MEMORY CELLS

CROSS-REFERENCE TO RELATED APPLICATIONS

This application claims the benefit of U.S. Provisional Patent Application 60/981,116, filed Oct. 19, 2007, U.S. Provisional Patent Application 60/982,480, filed Oct. 25, 2007, U.S. Provisional Patent Application 60/983,272, filed Oct. 29, 2007, and U.S. Provisional Patent Application 61/045,628, filed Apr. 17, 2008, whose disclosures are incorporated herein by reference.

FIELD OF THE INVENTION

The present invention relates generally to memory devices, and particularly to methods and systems for correcting read errors caused by voltage drifts in analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

The analog values stored in analog memory cells may drift over time, such as because of aging or change in temperature or supply voltage. Such drifts sometimes cause reading errors and may therefore degrade the memory device performance. Various methods for reducing drifts in analog memory cells are known in the art. For example, U.S. Patent Application Publication 2006/0028875, whose disclosure is incorporated herein by reference, describes drift compensation methods in which a plurality of memory cells are managed by obtaining values of environmental parameters of the cells and adjusting values of one or more reference voltages of the cells accordingly. Alternatively, a statistic of at least some of the cells, relative to a single reference parameter that corresponds to a control parameter of the cells, is measured, and the value of the reference voltage is adjusted accordingly.

U.S. Pat. No. 6,731,557, whose disclosure is incorporated herein by reference, describes a method of refreshing an electrically erasable and programmable non-volatile memory having a plurality of memory cells. The method includes verifying whether a memory cell has drifted from a correct condition (i.e., a predetermined voltage and/or voltage range), and individually restoring the correct condition of the memory cell if the result of the verification is positive.

U.S. Pat. No. 5,901,089, whose disclosure is incorporated herein by reference, describes an integrated circuit memory system having memory cells capable of storing multiple bits per memory cell. The system has a restoring operation in which a memory cells' stored charge, which may drift from its initially set condition, is maintained within one of a plurality of predetermined levels corresponding to digital bits of information and defined by a set of special reference voltage values. The system has mini-programming and mini-erasing operations to move only the amount of charge into and out of the memory cell sufficient to keep the charge within the predetermined levels.

U.S. Pat. No. 7,102,924, whose disclosure is incorporated herein by reference, describes techniques of overcoming a degradation of the apparent charge levels stored in one row of memory cells as a result of subsequently programming an adjacent row of memory cells. After storing the data of the subsequently-programmed row elsewhere, the charge levels of its cells are driven to a common level. The charge levels of the first row of cells then have a uniform influence from the charge levels of the second row, and, as a result, the chance of successfully reading the data stored in the first row is significantly increased.

U.S. Pat. No. 7,099,194, whose disclosure is incorporated herein by reference, describes an error recovery technique that is used on marginal nonvolatile memory cells. A marginal memory cell is unreadable because it has a voltage threshold (VT) of less than zero volts. By biasing adjacent memory cells, the voltage threshold of the marginal memory cells is shifted, so that it is a positive value. Then the VT of the marginal memory cell can be determined.

SUMMARY OF THE INVENTION

An embodiment of the present invention provides a method for data storage, including:

storing data in a group of analog memory cells by writing respective first storage values into the memory cells;

after storing the data, reading respective second storage values from the memory cells;

identifying a subset of the memory cells in which the respective second storage values have drifted below a minimum readable value;

operating on the memory cells in the subset so as to cause the second storage values of at least one of the memory cells in the subset to exceed the minimum readable value; and re-reading at least the modified second storage values so as to reconstruct the stored data.

In some embodiments, operating on the memory cells in the subset includes applying one or more programming pulses to the memory cells in the subset. Applying the programming pulses may include determining a first number of the memory cells in the subset, and applying the programming pulses iteratively until a second number of the memory cells in the subset, whose second storage values increased above the minimum readable value due to the programming pulses, exceeds the first number.

In an embodiment, operating on the memory cells in the subset includes re-reading multiple instances of the second storage values from the memory cells in the subset, selecting one or more of the memory cells in the subset in which at least one of the re-read instances of the second storage values was raised above the minimum readable value due to reading noise, and associating the selected memory cells with a programming level corresponding to the first storage values that are directly above the minimum readable value.

In another embodiment, operating on the memory cells in the subset includes modifying a temperature of the memory cells. Modifying the temperature may include modifying a rate of memory access operations applied to the memory cells, or controlling a heating device that is thermally coupled to the memory cells. In a disclosed embodiment, storing the data includes encoding the data with an Error Correcting Code (ECC), and the method includes applying ECC decoding to at least the re-read modified second storage values.

In yet another embodiment, the first and second storage values include threshold voltages of the analog memory cells, and the minimum readable voltage includes zero volts. In still another embodiment, identifying the subset includes detecting a difference in an operating condition of the memory cells between a first time at which the first storage values were written and a second time at which the second storage values were read. In some embodiments, identifying the subset includes comparing a first number of the memory cells in which the first storage values are below the minimum readable value and a second number of the memory cells in which the second storage values are below the minimum readable value.

There is additionally provided, in accordance with an embodiment of the present invention, a method for data storage, including:

storing data in a group of analog memory cells by writing respective first storage values into the memory cells;

after storing the data, reading respective second storage values from the memory cells;

identifying a subset of the memory cells in which the respective second storage values have drifted below a minimum readable value;

writing third storage values into one or more of the memory cells that neighbor the memory cells in the subset, wherein the third storage values are selected so as to cause the second storage values of at least one of the memory cells in the subset to exceed the minimum readable value; and re-reading at least the modified second storage values so as to reconstruct the stored data.

There is also provided, in accordance with an embodiment of the present invention, apparatus for data storage, including:

an interface, which is operative to communicate with a memory that includes a plurality of analog memory cells; and a processor, which is coupled to store data in a group of the analog memory cells by writing respective first storage values into the memory cells, to read respective second storage values from the memory cells after storing the data, to identify a subset of the memory cells in which the respective second storage values have drifted below a minimum readable value, to operate on the memory cells in the subset so as to cause the second storage values of at least one of the memory cells in the subset to exceed the minimum readable value, and to re-read at least the modified second storage values so as to reconstruct the stored data.

There is further provided, in accordance with an embodiment of the present invention, apparatus for data storage, including:

an interface, which is operative to communicate with a memory that includes a plurality of analog memory cells; and a processor, which is coupled to store data in a group of the analog memory cells by writing respective first storage values into the memory cells, to read respective second storage values from the memory cells after storing the data, to identify a subset of the memory cells in which the respective second storage values have drifted below a minimum readable value, to write third storage values into one or more of the memory cells that neighbor the memory cells in the subset, wherein the third storage values are selected so as to cause the second storage values of at least one of the memory cells in the subset to exceed the minimum readable value, and to re-read at least the modified second storage values so as to reconstruct the stored data.

There is additionally provided, in accordance with an embodiment of the present invention, apparatus for data storage, including:

a memory, which includes a plurality of analog memory cells; and a processor, which is coupled to store data in a group of the analog memory cells by writing respective first storage values into the memory cells, to read respective second storage values from the memory cells after storing the data, to identify a subset of the memory cells in which the respective second storage values have drifted below a minimum readable value, to operate on the memory cells in the subset so as to cause the second storage values of at least one of the memory cells in the subset to exceed the minimum readable value, and to re-read at least the modified second storage values so as to reconstruct the stored data.

There is further provided, in accordance with an embodiment of the present invention, apparatus for data storage, including:

a memory, which includes a plurality of analog memory cells; and a processor, which is coupled to store data in a group of the analog memory cells by writing respective first storage values into the memory cells, to read respective second storage values from the memory cells after storing the data, to identify a subset of the memory cells in which the respective second storage values have drifted below a minimum readable value, to write third storage values into one or more of the memory cells that neighbor the memory cells in the subset, wherein the third storage values are selected so as to cause the second storage values of at least one of the memory cells in the subset to exceed the minimum readable value, and to re-read at least the modified second storage values so as to reconstruct the stored data.

The present invention will be more fully understood from the following detailed description of the embodiments thereof, taken together with the drawings in which:

DETAILED DESCRIPTION OF EMBODIMENTS

Overview

Figure 1:
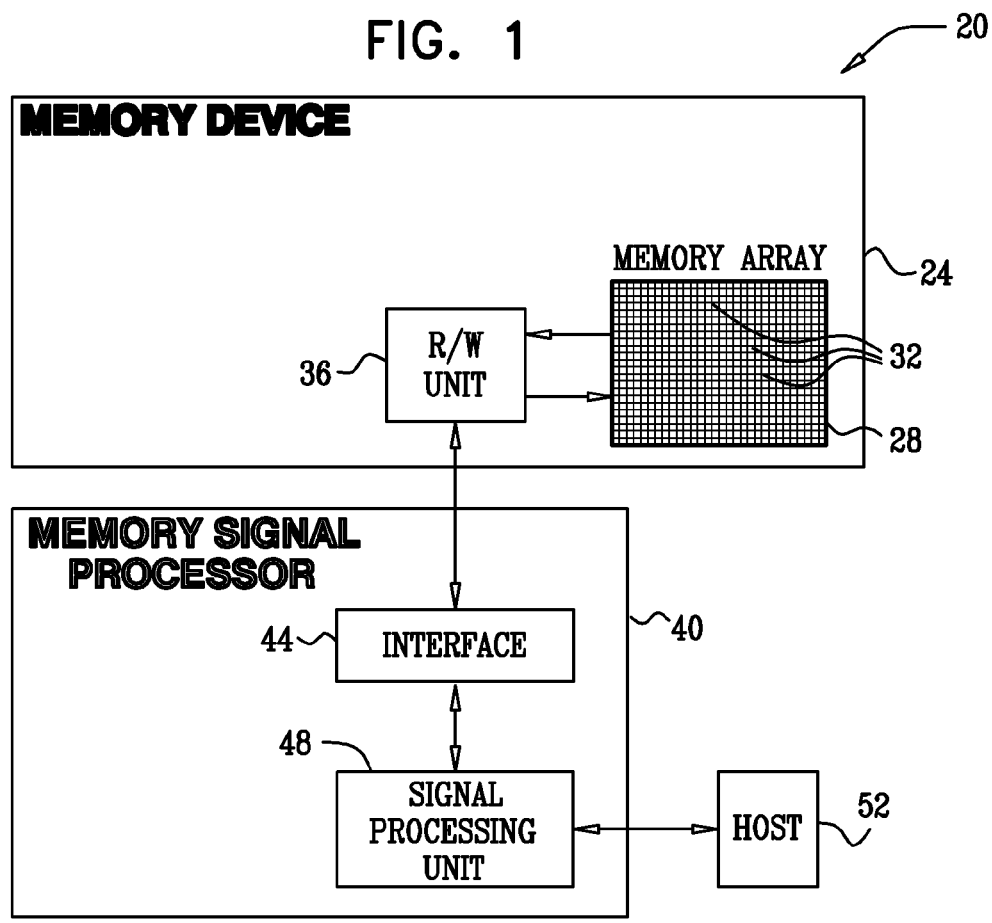
FIG. 1 is a block diagram that schematically illustrates a memory system, in accordance with an embodiment of the present invention.

In many memory devices, the threshold voltages (or other forms of storage values) of analog memory cells may drift from their programmed values due to aging, temperature variations, changes in supply voltage or other factors. Drifts of this sort often complicate the task of reading data that is stored in the memory cells, especially if some of the threshold voltages drift below a minimum value that can be sensed and read by the memory device.

For example, memory devices typically read data from analog memory cells by comparing the threshold voltages of the cells to one or more read thresholds. In a typical memory device configuration, a certain programming level (which also serves as an erased level) corresponds to negative threshold voltages, while the other programming levels correspond to different, respective positive threshold voltages. The reading/writing circuitry of the memory device, however, often cannot set the read thresholds to negative values. In this sort of device, if the threshold voltage of a given memory cell drifts from its initial positive value and becomes negative, reading the cell will produce a read error. Most known threshold adaptation schemes cannot compensate for this sort of drift, since the memory device cannot set the read thresholds to negative values.

Embodiments of the present invention provide improved methods and systems for compensating for drifts in the storage values of analog memory cells. In some embodiments, a Memory Signal Processor (MSP) is connected to a memory device, which comprises multiple analog memory cells. The MSP stores data in a group of the analog memory cells by writing respective storage values into the memory cells. At a certain point in time after storing the data, the MSP reads the storage values from the memory cells. In some cases, the read storage values will have drifted from the respective initially-written values. In particular, some of the read storage values may have drifted below a minimum readable value that can be sensed by the memory device. For example, some of the storage values may have drifted and became negative.

The MSP identifies a subset of the memory cells whose read storage values have drifted below the minimum readable value. Several techniques for detecting drift-related errors and for identifying cells whose storage values have drifted below the minimum readable value are described herein. The MSP operates on the memory cells in the identified subset so as to modify their storage values, such that the storage values of at least one of the memory cells in the subset will exceed the minimum readable value. After operating on the memory cells the MSP re-reads the storage values from the cells, so as to reconstruct the stored data. Since at this stage the storage values of at least some of the memory cells in the subset are raised above the minimum readable value, data reconstruction is likely to succeed.

The MSP may operate on the memory cells in various ways in order to raise their storage values above the minimum readable value. For example, in some embodiments the MSP instructs the reading/writing circuitry of the memory device to apply one or more programming pulses to the memory cells in the subset (the memory cells whose storage values have drifted below the minimum readable value). Typically, the stored data is encoded with an Error Correction code, and the MSP applies ECC decoding to the data that is re-read from the cells after applying the programming pulses. In some embodiments, the MSP initially estimates the number of cells whose storage values have drifted below the minimum readable value, and then applies programming pulses in an iterative manner, until it detects that a sufficient number of cells have increased their storage values above the minimum.

In an alternative embodiment, the MSP re-reads the memory cells in the subset multiple times. Since the read storage values are affected by random read noise, when the storage value of a given cell is only slightly below the minimum readable value, at least one of the re-read values is likely to exceed the minimum value. Using this technique, the MSP detects the "most positive" cells in the subset, i.e., the cells whose storage values are closest to the minimum readable value. The MSP then associates these cells with the programming level whose storage values are immediately above the minimum readable value when reconstructing the data.

Further alternatively, the MSP may raise the storage values of the cells in the subset above the minimum readable value by programming neighboring cells to relatively high storage values. (The original content of the neighboring cells is typically copied to an alternative location first.) Writing large storage values into neighboring cells typically causes strong cross-coupling effects, which in turn increase the storage values of the cells in the subset. In another disclosed embodiment, the MSP increases the storage values of the cells in the subset above the minimum readable value by modifying the temperature of the memory device. The MSP may control the memory device's temperature, for example, by controlling the rate of memory access operations applied to the device.

In most known data storage systems, the programming levels of the memory device have to be designed with a sufficiently large margin from the minimum readable value to prevent storage values from subsequently drifting below the minimum value. This constraint reduces the overall range of storage values that can be used for data storage, and therefore reduces the capacity and/or storage reliability of the memory device. Unlike these known schemes, the methods and systems described herein enable the MSP to successfully compensate for drifts and successfully read data from the memory cells even when some storage values have drifted below the minimum readable value. As such, the disclosed methods and systems provide a considerable improvement in the achievable capacity and storage reliability of analog memory cells.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 24 comprises a reading/writing (R/W) unit 36, which converts data for storage in the memory device to storage values and writes them into memory cells 32. In alternative embodiments, the R/W unit does not perform the conversion, but is provided with the storage values for storage in the cells. The R/W unit typically (although not necessarily) programs the cells using an iterative Program and Verify (P&V) process, as is known in the art. When reading data out of array 28, R/W unit 36 converts the storage values of memory cells 32 into digital samples having a resolution of one or more bits. Data is typically written to and read from the memory cells in groups that are referred to as pages. In addition to writing and reading data, R/W unit 36 erases groups of memory cells 32 before they are used for storing data.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Typically, unit 48 encodes the data for storage using a suitable Error Correction Code (ECC), and decodes the ECC of data retrieved from memory.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system, or by a suitable memory controller. In some implementations, a single MSP 40 may be connected to multiple memory devices 24. In yet another embodiment, some or all of the MSP functionality may be carried out by a separate unit, referred to as a memory extension, which acts as a slave of memory device 24.

Typically, the MSP (or any other controller or processor that carries out some or all of the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks.

In some embodiments, R/W unit 36 programs memory cells 32 using an iterative Program and Verify (P&V) process. In a typical P&V process, an entire memory page is written by applying a sequence of programming pulses to a group of memory cells that are mapped to this page. The level of the programming pulses increases incrementally from pulse to pulse. The storage values programmed in the cells are read ("verified") after each pulse, and the iterations continue until the desired levels are reached.

Threshold Voltage Drift in Analog Memory Cells

The threshold voltages stored in analog memory cells may drift over time. Voltage drifts may be caused, for example, by charge leakage from the cells (also referred to as cell aging), changes in temperature, supply voltage or other environmental conditions, or by various other mechanisms. Voltage drifts typically change the positions and characteristics of the threshold voltage distributions of the different programming levels, and therefore complicate the task of reading data from the memory cells.

In particular, a memory device can typically sense and read threshold voltages down to a certain minimum readable value (e.g., 0V). Reading data correctly from the memory cells is particularly challenging when some of the threshold voltages drift below the minimum readable value supported by the memory device.

Figure 2A:
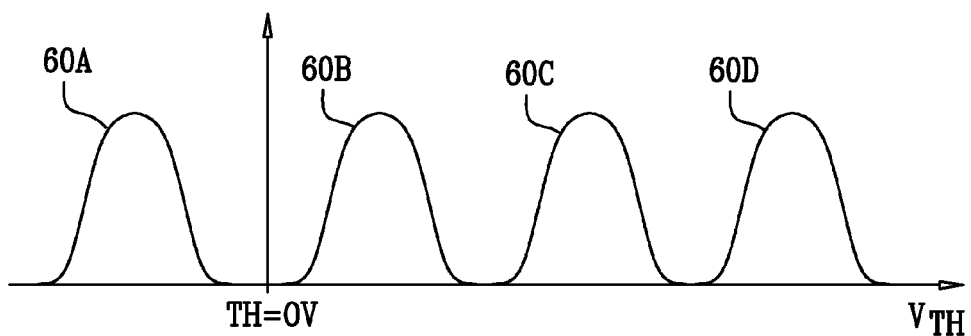
FIGS. 2A and 2B are graphs showing threshold voltage distributions in a group of analog memory cells, in accordance with an embodiment of the present invention.

FIG. 2A is a graph showing threshold voltage distributions in a group of analog memory cells 32, such as a word line or erasure block, in accordance with an embodiment of the present invention. In the present example, cells 32 comprise four-level cells, each storing two data bits, although the methods described herein are applicable to memory cells storing any number of bits in any number of programming levels. In the four-level example of FIG. 2A, each cell can be programmed to one of four possible levels, each corresponding to a certain combination of two bit values. Because of various errors and tolerances, the threshold voltages in the cells that belong to a given programming level are distributed around the nominal threshold voltage of this level.

FIG. 2A shows the threshold voltage distribution in the group of memory cells when the cells are programmed with data. In the present example, the threshold voltages are distributed in accordance with distributions 60A . . . 60D, which correspond to the four programming levels.

Distribution 60A corresponds to a programming level having negative threshold voltages. This programming level also serves as an erased level. In other words, when a given memory block is erased, all of its cells are brought to the erased level by programming them to an appropriate negative threshold voltage.

Reading data from the memory cells is usually performed by comparing the cells' threshold voltages to one or more read thresholds. This task is carried out by R/W unit 36. The R/W unit typically positions the read thresholds to lie between adjacent programming levels, so that the comparison results differentiate between cells that are programmed to different levels.

Many memory devices cannot set read thresholds to negative values. Therefore, R/W unit 36 often differentiates between the erased level and the first positive level (i.e., between distributions 60A and 60B) by setting a read threshold to 0V.

Figure 2B:
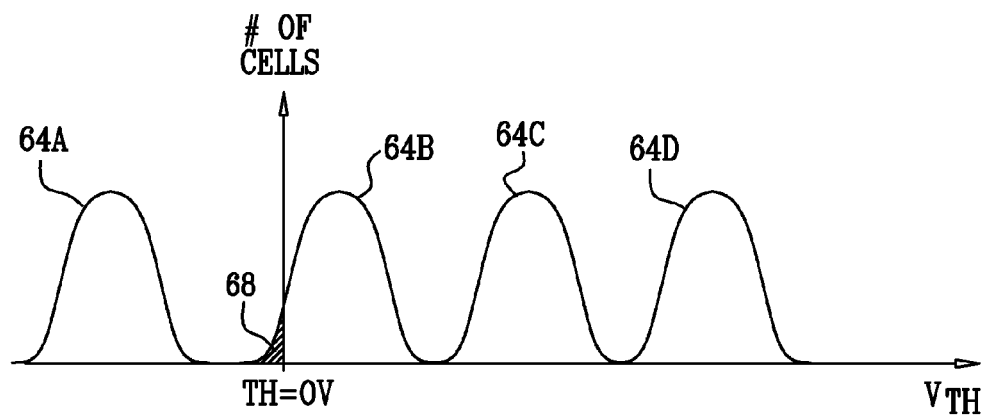

FIG. 2B shows the threshold voltage distribution in the group of memory cells after the threshold voltages of the cells have drifted. The threshold voltages in FIG. 2B are distributed in accordance with distributions 64A . . . 64D. As can be seen in the figure, distributions 64A . . . 64D have drifted with respect to distributions 60A . . . 60D, respectively. For example, FIG. 2B may reflect the threshold voltage distribution after a long retention period, and/or at an extreme temperature or supply voltage.

Some memory systems are able to adjust the positions of the read threshold voltages in order to compensate for such drifts. Examples of threshold adaptation techniques are described, for example, in PCT International Publications WO 2007/132457 and WO 2008/053472, whose disclosures are incorporated herein by reference.

However, when voltage drifts cause some of the initially-positive threshold voltages to become negative, the read thresholds can no longer be set to the optimal positions. Consider, for example, distribution 60B in FIG. 2A and distribution 64B in FIG. 2B. When the cells were originally programmed, the erased level was distributed in accordance with distribution 60A having negative voltages, and the lowest positive programming level was distributed in accordance with distribution 60B having positive voltages. After the cell voltages have drifted, the erased level is distributed in accordance with distribution 64A, and the lowest positive programming level is distributed in accordance with distribution 64B.

As can be seen in FIG. 2B, some of the threshold voltages in distribution 64B, which lie in a region 68 of the distribution, have drifted and became negative. Since the memory device can only set read thresholds to non-negative values, the memory device cannot set a read threshold that differentiates properly between distributions 64A and 64B. Setting the lowest possible read threshold value (0V) will still generate a significant number of read errors, since the cells whose threshold voltages lie in region 68 fall on the wrong side of the threshold and will be read incorrectly.

Embodiments of the present invention that are described herein provide improved methods and systems for voltage drift compensation in analog memory cells. In particular, the disclosed methods and systems enable a memory device to successfully read memory cells whose threshold voltages became negative as a result of voltage drift, even though the memory device may support only non-negative read thresholds.

Although the embodiments described herein refer to 0V as the minimum threshold voltage that can be read by the memory device, the disclosed methods and systems can be used with any other minimum readable value. In other words, whenever a disclosed method refers to negative or positive threshold voltages, the method can be generalized in a straightforward manner to refer to threshold voltages that are lower or higher than the minimum readable value supported by the memory device.

Drift Compensation by Selective Application of Programming Pulses

In some embodiments, MSP 40 identifies a subset of the memory cells whose threshold voltages are likely to have become negative due to voltage drift. R/W unit 36 then applies one or more additional programming pulses to the identified cells, in order to cause their threshold voltages to become positive. The MSP then re-reads the cells and reconstructs the data. Typically, the data stored in the memory cells is encoded with an Error Correction Code (ECC), and the MSP reconstructs the data by applying ECC decoding after re-reading the cells.

The MSP can detect drift-related errors in various ways. For example, the MSP may detect read errors in a given cell group (e.g., a page) by detecting ECC decoding failure. In some embodiments, the stored data is encoded with an Error Detection Code (EDC) such as a Cyclic Redundancy Check (CRC). The MSP may identify read errors by detecting EDC failures.

Once detecting read errors in a given cell group, the MSP can identify whether the read errors are likely to have been caused by voltage drift. In some embodiments, the MSP identifies a likely drift-related error based on a-priori knowledge or estimation of certain operating conditions of the cells. Such operating conditions may comprise, for example, the difference in temperature between the time the cells were programmed and the time the cells are read, the difference in supply voltage between the time the cells were programmed and the time the cells are read, the number of Programming/Erasure (P/E) cycles the cells have gone through, the time period that elapsed since the cells were programmed, and/or any other suitable attribute.

Alternatively, the MSP may identify a drift-related error by observing that a relatively large number of cells in the group have threshold voltages that lie in a predefined voltage range near zero. In other words, the MSP may detect that a substantial portion of the threshold voltage distribution lies near 0V.

Further alternatively, the MSP may count the number of cells that are set to the erased level at the time of programming, and store this value in memory (e.g., in one or more of cells 32). When the cells are read at a later time, the MSP compares the current number of cells whose threshold voltage is negative to the stored number. If a read error is detected in a given cell group, and the number of cells having negative threshold voltages has increased considerably between the time the cells were programmed and the time the cells are read, the MSP may conclude that the error is caused by voltage drift.

Figure 3:
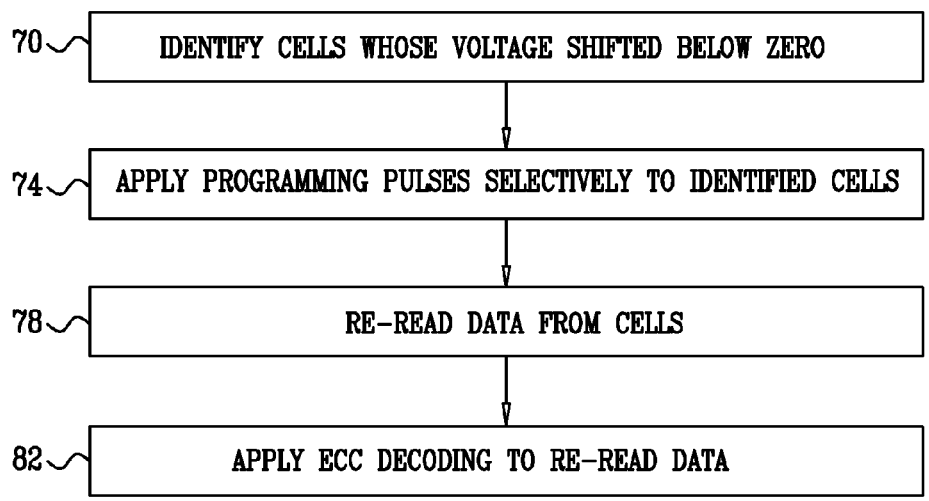
FIG. 3 is a flow chart that schematically illustrates a method for compensating for threshold voltage drift, in accordance with an embodiment of the present invention.

FIG. 3 is a flow chart that schematically illustrates a method for compensating for threshold voltage drift, in accordance with an embodiment of the present invention. The method begins once the MSP detects that the read errors in a given cell group are caused by voltage drift. The MSP identifies a subset of the cells whose threshold voltages have become negative, at a subset identification step 70.

The MSP instructs R/W unit 36 to apply one or more additional programming pulses to the cells in the subset, at a pulse programming step 74. The R/W unit applies these pulses selectively to the cells in the subset. In some embodiments, the additional programming pulses can also be applied to cells whose threshold voltages are positive but close to zero. Typically, the programming pulses are relatively small in amplitude and attempt to increase the threshold voltages of the cells slightly, e.g., on the order of several hundred mV, although other suitable amplitudes can also be used. Such a process typically narrows the distribution of the lowest positive programming level, and enables better differentiation between this level and the erased level. The effect of this technique of the threshold voltage distributions of the cells is demonstrated in FIG. 4 below.

The MSP (using the R/W unit) re-reads the group of cells, at a re-reading step 78. The re-reading operation attempts to distinguish between cells that are set to the erased level and cells that are set to the lowest positive programming level. Typically, the re-reading operation can be carried out with only a single read threshold. The MSP may re-read the entire group of cells or only the subset of cells identified at step 70 above, if the memory device supports reading of selected memory cells. The MSP applies ECC decoding to the re-read cells so as to reconstruct the data, at an ECC decoding step 82.

Optionally, the MSP may verify that the programming pulses applied at step 74 above did not degrade the data reliability in the memory cells in the group, or in other memory cells in device 24. The MSP may take corrective measures if needed. For example, before applying the programming pulses at step 74, the MSP may read one or more pages that may be affected by this operation. The MSP can read these pages again after step 74 has been performed. If the potentially-affected pages have indeed been affected significantly by the recovery operation applied at step 74, the MSP may re-program them at another location in device 24.

Figure 4:
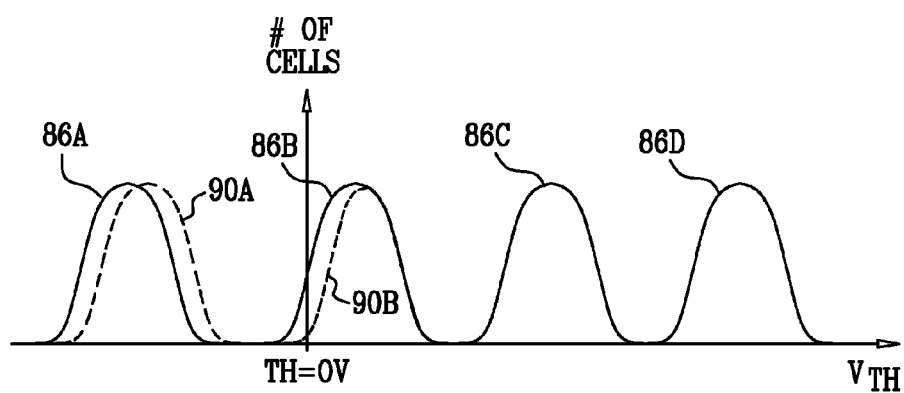
FIG. 4 is a graph showing threshold voltage distributions before and after drift compensation, in accordance with an embodiment of the present invention.

FIG. 4 is a graph showing threshold voltage distributions before and after applying the drift compensation method of FIG. 3, in accordance with an embodiment of the present invention. Curves 86A . . . 86D show the threshold voltage distributions of the four programming levels before drift compensation is applied. As can be seen in the figure, a considerable portion of distribution 86B (which corresponds to the lowest positive programming level) became negative due to voltage drift.

Curves 90A and 90B show the threshold voltage distributions of the erased level and the lowest positive level, respectively, after applying the drift compensation method of FIG. 3. Comparison of distribution 90B and distribution 86B demonstrates the effect of the programming pulses applied at step 74 of the method of FIG. 3. In the present example, programming pulses are applied to cells having negative and slightly-positive threshold voltages. As a result, distribution 90B is narrower that distribution 86B and is substantially positive. Since programming pulses were applied to all the cells having negative threshold voltages, distribution 90A is shifted to the right in comparison with distribution 86A.

As can be appreciated, a read threshold set to 0V will differentiate properly between distributions 90A and 90B. Such a read threshold would not have performed well in differentiating between distributions 86A and 86B.

Figure 5:
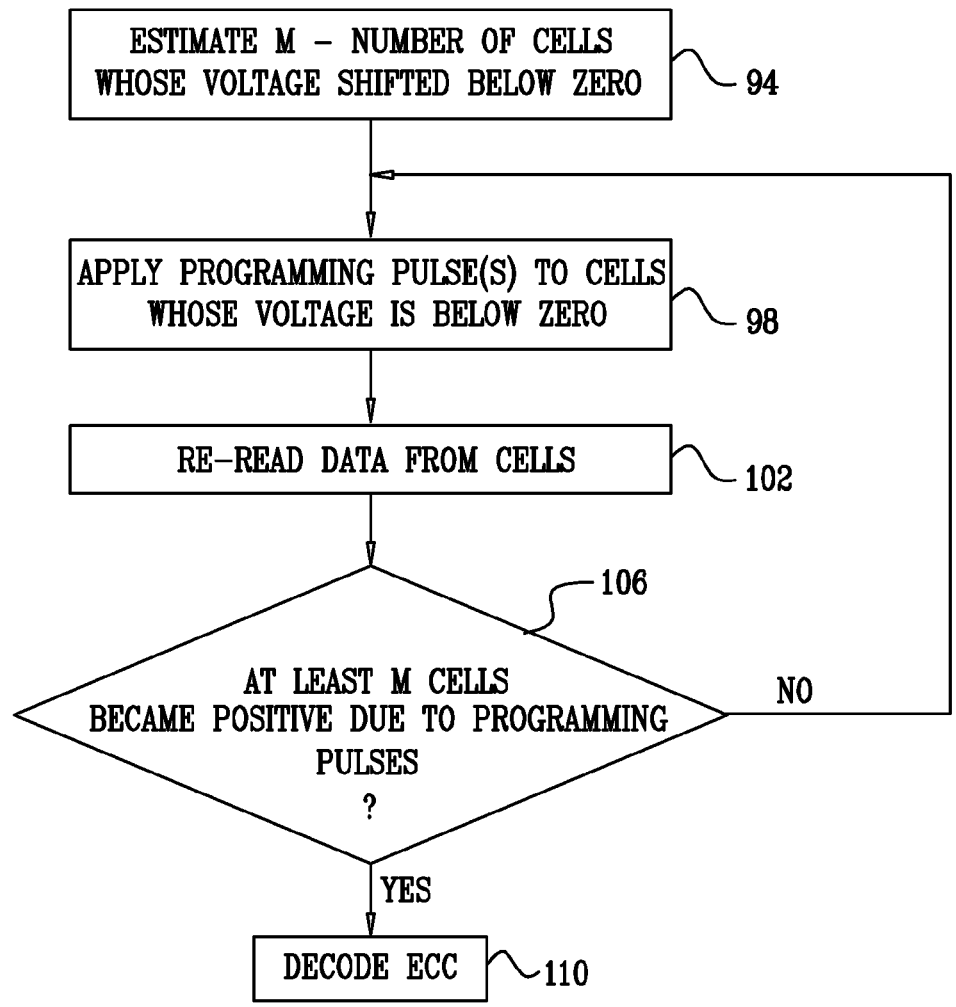
FIGS. 5-7 are flow charts that schematically illustrate methods for threshold voltage drift compensation, in accordance with alternative embodiments of the present invention.

FIG. 5 is a flow chart that schematically illustrates a method for threshold voltage drift compensation, in accordance with another embodiment of the present invention. In this method, the MSP initially estimates M–the number of cells whose threshold voltages drifted below 0V, and then applies programming pulses iteratively. The iterative process terminates when the number of cells whose threshold voltages are raised above 0V reaches M. This method is often more reliable in recognizing the cells whose threshold voltages drifted below zero than the method of FIG. 3.

The method of FIG. 5 begins with MSP 40 estimating the number of cells in a given group (e.g., page or block) whose threshold voltages have drifted below 0V, at an estimation step 94. This number is denoted M. The MSP may estimate M in several ways. For example, the MSP may count, for each group of cells, the number of cells that are set to the erased level at the time the cells are programmed. The MSP stores this number at a suitable location (e.g., in one or more of cells 32). When the group of cells is read, the MSP counts the number of cells that are read as belonging to the erased level, and compares this number to the stored number. The difference between the two numbers is used as an estimate of the number of cells in the group, whose threshold voltages became negative as a result of voltage drift.

In an alternative embodiment, the MSP scrambles the stored data, such that the cells are distributed approximately evenly among the different programming levels. In such a configuration, for N-level memory cells, approximately 1/N of the cells are expected to be set to the erased level. When the group of cells is read, the MSP counts the number of cells that are read as belonging to the erased level, and compares this number to 1/N of the number of cells. The difference between the two numbers is used as an estimate of M.

The MSP now applies one or more programming pulses to the subset of cells whose threshold voltages are below 0V, at a pulse application step 98. The MSP re-reads the cells, at a re-reading step 102. The MSP counts the number of cells whose threshold voltages became positive as a result of the present iteration. The MSP checks whether M or more cells became positive as a result of applying the programming pulses so far, at a positive checking step 106. If less than M cells became positive, the method loops back to step 98 above, and the MSP continues to apply additional programming pulses.

Otherwise, i.e., when M or more cells have become positive as a result of the programming pulses, the MSP stops applying the pulses. Let L be the number of cells whose threshold voltages exceeded 0V as a result of the programming pulses, excluding the last iteration. In some embodiments, the L cells whose threshold voltages became positive due to the programming pulses of all but the last iteration are associated with the lowest positive programming level by the MSP. The M-L cells having the highest threshold voltages among the cells whose threshold voltages became positive due to the last programming iteration are also associated by the MSP with the lowest positive programming level.

Under these assumptions, the MSP applies ECC decoding to the read results of the last re-reading iteration, at a decoding step 110, so as to reconstruct the data. In alternative embodiments, the MSP applies ECC decoding to the re-read data at each iteration, without waiting for M or more cells to become positive. In these embodiments, the method may terminate as soon as ECC decoding is successful, even before M cells become positive.

In the description above, programming pulses are applied to the cells whose threshold voltage is lower than 0V. Generally, however, the MSP can apply programming pulses to the cells whose threshold voltage is lower than a certain (typically small) positive value denoted T. Typically, the programming pulses applied at step 98 have relatively small amplitudes and durations. The increment in amplitude from one pulse to the next is also relatively small.

Drift Compensation by Cell Re-Reading

The threshold voltages read from analog memory cells are often subject to fluctuations, which may be caused by various random read noise effects, such as Random Telegraph Signal (RTS) noise. Thus, when a given memory cell whose threshold voltage is slightly negative is read multiple times, there is high likelihood that the read threshold voltage will be positive in one or more of the read attempts. In some embodiments of the present invention, the MSP takes advantage of the read noise fluctuations in order to identify and read cells whose threshold voltages drifted and became slightly negative.

Figure 6:
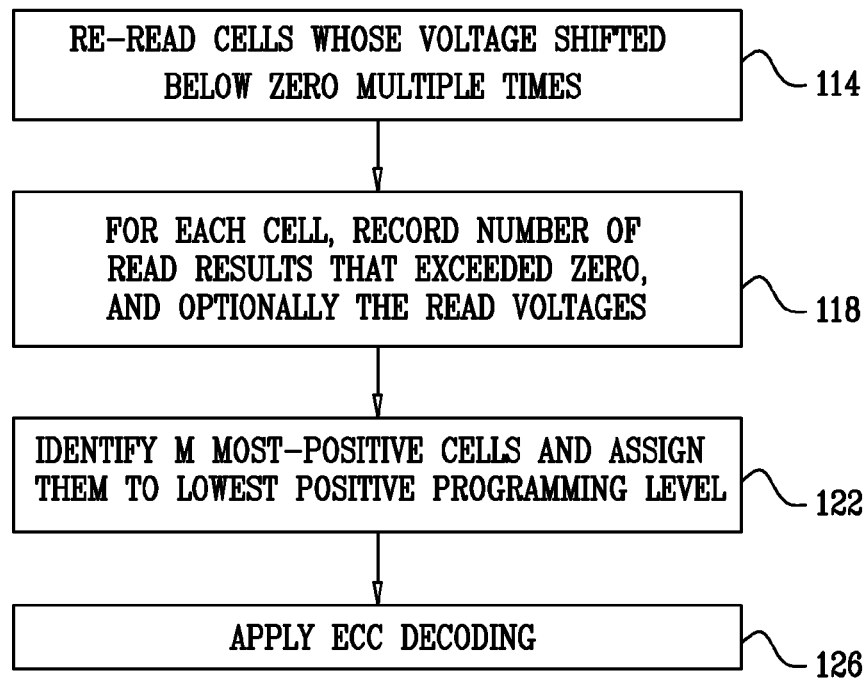

FIG. 6 is a flow chart that schematically illustrates a method for threshold voltage drift compensation, in accordance with yet another embodiment of the present invention. The method of FIG. 6 assumes that the MSP has detected and identified a drift-related error in a given group of cells, and has identified a subset of cells whose threshold voltages may have turned negative as a result of this drift. (Typically, it is not certain that the threshold voltages of all the cells in the subset were initially positive and became negative due to voltage drift effects. The subset is regarded as a set of candidates, which the MSP attempts to confirm using the method of FIG. 6.) The MSP may also determine M—the number of cells in the subset. Example methods for performing these tasks were described above.

The method begins with the MSP re-reading the cells in the subset multiple times, at a multiple reading step 114. Typically, the multiple read attempts are performed with a read threshold that is set to 0V. For each cell in the subset, the MSP records the number of times in which the threshold voltage read from the cell was positive, at a positive number recording step 118. In some embodiments, the MSP also records the read threshold voltages. Since the read noise may vary slowly over time (i.e., it may have a large de-correlation time constant, sometimes on the order of many milliseconds), the MSP may wait a certain time period between successive read attempts. The MSP may perform other tasks during the periods between read attempts.

The MSP identifies the M "most positive" cells out of the cells that were read as belonging to the erased level, at a most positive identification step 122. The most positive cells comprise the cells having the highest number of positive read results and/or the highest threshold voltages, as recorded by the MSP at step 118 above. The MSP associates these M cells with the lowest positive programming level. Under these assumptions, the MSP applies ECC decoding to the cells, at a decoding step 126, so as to reconstruct the data.

Thus, the method of FIG. 6 enables the MSP to read cells whose threshold voltages are slightly negative using a non-negative read threshold, identify that these cells are likely to have been affected by voltage drift, and associate such cells with the lowest positive programming level.

Drift Compensation by Programming Neighboring Cells

The threshold voltages read from analog memory cells are sometimes affected by the threshold voltages of other cells in the array. For example, the threshold voltage of a given cell may be affected by floating-gate coupling from neighboring cells, e.g., from horizontal neighbors on the same word line or from vertical neighbors on the same bit line. As another example, the memory cells in some NAND Flash devices are arranged in strings of cells that are connected in series, as is well-known in the art. The threshold voltage read from a given cell may be affected by the threshold voltages of other cells in the same NAND string.

Such cross-coupling effects are often viewed as distortion that should be minimized, since it modified the threshold voltages read from the cells. In some embodiments of the present invention, however, the MSP takes advantage of these effects in order to raise the threshold voltages of cells that have drifted and became negative. In some embodiments, the MSP programs one or more neighbors of a target cell whose threshold voltage became negative to high values, in order to deliberately cause cross-coupling effects that would raise the threshold voltage read from the target cell above 0V.

Figure 7:
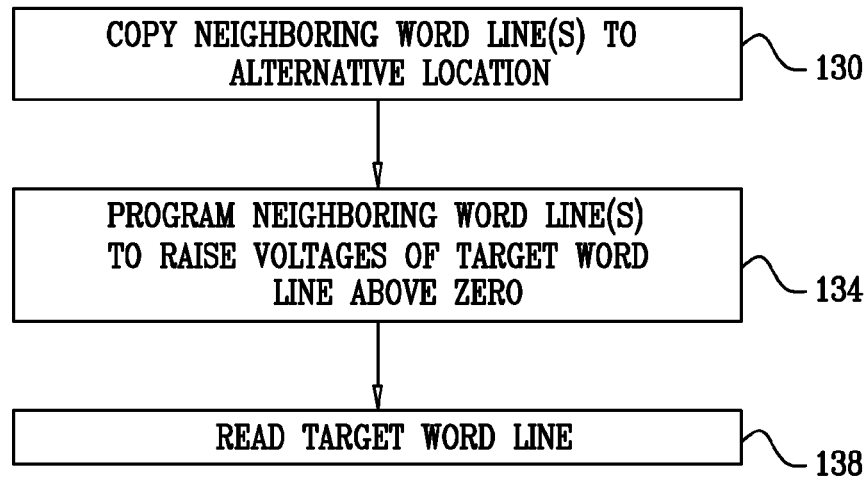

FIG. 7 is a flow chart that schematically illustrates a method for threshold voltage drift compensation, in accordance with an alternative embodiment of the present invention. The method assumes that the MSP has detected a drift-related error in a given group of cells, and has identified a subset of the cells whose threshold voltages drifted and became negative.

The description below refers to a process in which a drift-related error is found in a given word line (referred to as the target word line), and the cells of a neighboring word line are programmed to their maximum allowed threshold voltages in order to cause strong cross-coupling and increase the threshold voltages read from the cells of the target word line. In alternative embodiments, however, this method can be applied to any suitable group of target cells and any suitable group of neighboring cells. For example, the MSP may program other cells along the NAND string of a target cell. Typically, the neighboring cells are programmed to their maximum allowed threshold voltage, although other values can also be used.

The method of FIG. 7 begins with the MSP copying the content of the neighboring cells to an alternative location, at a copying step 130, since programming of the neighbor cells destroys their previous content. The MSP then programs the neighbor cells to their maximum allowed threshold voltages, at a neighbor programming step 134. Then, the MSP reads the cells of the target word line, at a target reading step 138. Since the target cells are read in the presence of strong cross-coupling, slightly-negative threshold voltages are increased and are likely to become positive. These positive threshold voltages can be read using a read threshold set to 0V. Typically, the MSP applies ECC decoding to the read results, so as to reconstruct the data. The MSP may then re-program the neighboring cells.

Drift Compensation by Modifying Memory Device Temperature

In many memory devices, a change in device temperature modifies the electrical properties of the memory cells and affects their threshold voltages. In some embodiments, the MSP can use this effect to raise cell threshold voltages that have drifted and become negative, to the point where these voltages become positive and can be read using a read threshold set to 0V.

In some embodiments, the MSP can control (i.e., increase or decrease) the temperature of memory device 24 by controlling the rate of memory access operations. Applying a high rate of memory access operations (e.g., read or write) to the memory device increases the device temperature, and vice versa. Thus, when the MSP detects a drift-related error in a group of target cells, it may change the device temperature in order to increase the threshold voltages of the target cells. Once increased, the target cells can be re-read using a read threshold that is set to 0V. Alternatively, the memory device may comprise a suitable heating device, which is thermally coupled to the memory cells and is thus able to control their temperature. In these embodiments, the MSP may control the memory device temperature by controlling the heating device.

Although the embodiments described herein mainly address data storage and retrieval in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
storing data in a group of analog memory cells of a memory by writing into the memory cells respective first storage values that are above a minimum readable value that can be sensed by the memory;
after storing the data, reading respective second storage values from the memory cells;
identifying a subset of the memory cells in which the respective second storage values have drifted from the respective first storage values that were above the minimum readable value and have decreased to below the minimum readable value;
operating on the memory cells in the identified subset so as to cause the second storage values of at least one of the memory cells in the subset to again exceed the minimum readable value; and
re-reading at least the modified second storage values so as to reconstruct the stored data.

2. The method according to claim 1, wherein operating on the memory cells in the subset comprises applying one or more programming pulses to the memory cells in the subset.

3. The method according to claim 2, wherein applying the programming pulses comprises determining a first number of the memory cells in the subset, and applying the programming pulses iteratively until a second number of the memory cells in the subset, whose second storage values increased above the minimum readable value due to the programming pulses, exceeds the first number.

4. A method for data storage, comprising:
storing data in a group of analog memory cells by writing respective first storage values into the memory cells;
after storing the data, reading respective second storage values from the memory cells;
identifying a subset of the memory cells in which the respective second storage values have drifted below a minimum readable value;
operating on the memory cells in the subset so as to cause the second storage values of at least one of the memory cells in the subset to exceed the minimum readable value; and
re-reading at least the modified second storage values so as to reconstruct the stored data,
wherein operating on the memory cells in the subset comprises re-reading multiple instances of the second storage values from the memory cells in the subset, selecting one or more of the memory cells in the subset in which at least one of the re-read instances of the second storage values was raised above the minimum readable value due to reading noise, and associating the selected memory cells with a programming level corresponding to the first storage values that are directly above the minimum readable value.

5. The method according to claim 1, wherein operating on the memory cells in the subset comprises modifying a temperature of the memory cells.

6. The method according to claim 5, wherein modifying the temperature comprises modifying a rate of memory access operations applied to the memory cells.

7. The method according to claim 5, wherein modifying the temperature comprises controlling a heating device that is thermally coupled to the memory cells.

8. The method according to claim 1, wherein storing the data comprises encoding the data with an Error Correcting Code (ECC), and comprising applying ECC decoding to at least the re-read modified second storage values.

9. The method according to claim 1, wherein the first and second storage values comprise threshold voltages of the analog memory cells, and wherein the minimum readable voltage comprises zero volts.

10. The method according to claim 1, wherein identifying the subset comprises detecting a difference in an operating condition of the memory cells between a first time at which the first storage values were written and a second time at which the second storage values were read.

11. The method according to claim 1, wherein identifying the subset comprises comparing a first number of the memory cells in which the first storage values are below the minimum readable value and a second number of the memory cells in which the second storage values are below the minimum readable value.

12. A method for data storage, comprising:
storing data in a group of analog memory cells by writing respective first storage values into the memory cells;
after storing the data, reading respective second storage values from the memory cells;
identifying a subset of the memory cells in which the respective second storage values have drifted below a minimum readable value;
writing third storage values into one or more of the memory cells that neighbor the memory cells in the subset, wherein the third storage values are selected so as to cause the second storage values of at least one of the memory cells in the subset to exceed the minimum readable value; and
re-reading at least the modified second storage values so as to reconstruct the stored data.

13. Apparatus for data storage, comprising:

an interface, which is operative to communicate with a memory that includes a plurality of analog memory cells; and a processor, which is coupled to store data in a group of the analog memory cells by writing into the memory cells respective first storage values that are above a minimum readable value that can be sensed by the memory, to read respective second storage values from the memory cells after storing the data, to identify a subset of the memory cells in which the respective second storage values have drifted from the respective first storage values that were above the minimum readable value and have decreased to below a the minimum readable value, to operate on the memory cells in the identified subset so as to cause the second storage values of at least one of the memory cells in the subset to again exceed the minimum readable value, and to re-read at least the modified second storage values so as to reconstruct the stored data.

14. The apparatus according to claim 13, wherein the processor is coupled to apply one or more programming pulses to the memory cells in the subset.

15. The apparatus according to claim 14, wherein the processor is coupled to determine a first number of the memory cells in the subset and to apply the programming pulses iteratively until a second number of the memory cells in the subset, whose second storage values increased above the minimum readable value due to the programming pulses, exceeds the first number.

16. Apparatus for data storage, comprising:
an interface, which is operative to communicate with a memory that includes a plurality of analog memory cells; and a processor, which is coupled to store data in a group of the analog memory cells by writing respective first storage values into the memory cells, to read respective second storage values from the memory cells after storing the data, to identify a subset of the memory cells in which the respective second storage values have drifted below a minimum readable value, to operate on the memory cells in the subset so as to cause the second storage values of at least one of the memory cells in the subset to exceed the minimum readable value, and to re-read at least the modified second storage values so as to reconstruct the stored data, wherein the processor is coupled to re-read multiple instances of the second storage values from the memory cells in the subset, to select one or more of the memory cells in the subset in which at least one of the re-read instances of the second storage values was raised above the minimum readable value due to reading noise, and to associate the selected memory cells with a programming level corresponding to the first storage values that are directly above the minimum readable value.

17. The apparatus according to claim 13, wherein the processor is coupled to operate on the memory cells in the subset by modifying a temperature of the memory cells.

18. The apparatus according to claim 17, wherein the processor is coupled to modify the temperature by modifying a rate of memory access operations applied to the memory cells.

19. The apparatus according to claim 17, and comprising a heating device that is thermally coupled to the memory cells, wherein the processor is coupled to modify the temperature by controlling the heating device.

20. The apparatus according to claim 13, wherein the processor is coupled to encode the stored data with an Error Correcting Code (ECC), and to apply ECC decoding to at least the re-read modified second storage values.

21. The apparatus according to claim 13, wherein the first and second storage values comprise threshold voltages of the analog memory cells, and wherein the minimum readable voltage comprises zero volts.

22. The apparatus according to claim 13, wherein the processor is coupled to identify the subset by detecting a difference in an operating condition of the memory cells between a first time at which the first storage values were written and a second time at which the second storage values were read.

23. The apparatus according to claim 13, wherein the processor is coupled to identify the subset by comparing a first number of the memory cells in which the first storage values are below the minimum readable value and a second number of the memory cells in which the second storage values are below the minimum readable value.

24. Apparatus for data storage, comprising:
an interface, which is operative to communicate with a memory that includes a plurality of analog memory cells; and a processor, which is coupled to store data in a group of the analog memory cells by writing respective first storage values into the memory cells, to read respective second storage values from the memory cells after storing the data, to identify a subset of the memory cells in which the respective second storage values have drifted below a minimum readable value, to write third storage values into one or more of the memory cells that neighbor the memory cells in the subset, wherein the third storage values are selected so as to cause the second storage values of at least one of the memory cells in the subset to exceed the minimum readable value, and to re-read at least the modified second storage values so as to reconstruct the stored data.

25. Apparatus for data storage, comprising:
a memory, which comprises a plurality of analog memory cells; and a processor, which is coupled to store data in a group of the analog memory cells by writing into the memory cells respective first storage values that are above a minimum readable value that can be sensed by the memory, to read respective second storage values from the memory cells after storing the data, to identify a subset of the memory cells in which the respective second storage values have drifted from the respective first storage values that were above the minimum readable value and have decreased to below the minimum readable value, to operate on the memory cells in the identified subset so as to cause the second storage values of at least one of the memory cells in the subset to again exceed the minimum readable value, and to re-read at least the modified second storage values so as to reconstruct the stored data.

26. Apparatus for data storage, comprising:
a memory, which comprises a plurality of analog memory cells; and a processor, which is coupled to store data in a group of the analog memory cells by writing respective first storage values into the memory cells, to read respective second storage values from the memory cells after storing the data, to identify a subset of the memory cells in which the respective second storage values have drifted below a minimum readable value, to write third storage values into one or more of the memory cells that neighbor the memory cells in the subset, wherein the third storage values are selected so as to cause the second storage values of at least one of the memory cells in the subset to exceed the minimum readable value, and to re-read at least the modified second storage values so as to reconstruct the stored data.

27. The method according to claim 1, wherein storing the data comprises writing the first storage values in an iterative Programming & Verification (P&V) process in which the first storage values are final target values that represent the data to be stored in the memory cells, and wherein identifying the subset comprises identifying the memory cells in which the final target values of the P&V process have drifted below the minimum readable value.

28. The apparatus according to claim 13, wherein the processor is coupled to write the first storage values in an iterative Programming & Verification (P&V) process in which the first storage values are final target values that represent the data to be stored in the memory cells, and to identify the subset by identifying the memory cells in which the final target values of the P&V process have drifted below the minimum readable value.

\* \* \* \* \*